United States Patent
Habitz et al.

(10) Patent No.: US 7,464,359 B2
(45) Date of Patent: Dec. 9, 2008

(54) METHOD FOR RE-ROUTING AN INTERCONNECTION ARRAY TO IMPROVE SWITCHING BEHAVIOR IN A SINGLE NET AND AN ASSOCIATED INTERCONNECTION ARRAY STRUCTURE

(75) Inventors: Peter A. Habitz, Hinesburg, VT (US); William J. Livingstone, Underhill, VT (US)

(73) Assignee: International Business Machines Corporation, Armonk, NY (US)

(*) Notice: Subject to any disclaimer, the term of this patent is extended or adjusted under 35 U.S.C. 154(b) by 296 days.

(21) Appl. No.: 11/277,541

(22) Filed: Mar. 27, 2006

(65) Prior Publication Data

US 2007/0226673 A1  Sep. 27, 2007

(51) Int. Cl.
*G06F 17/50* (2006.01)
(52) U.S. Cl. ............................................. 716/14; 716/6
(58) Field of Classification Search ................. 716/6, 716/10, 14

See application file for complete search history.

(56) References Cited

U.S. PATENT DOCUMENTS

| | | | |
|---|---|---|---|
| 5,534,732 | A | 7/1996 | DeBrosse et al. |
| 6,327,170 | B1 | 12/2001 | Mueller et al. |
| 6,449,195 | B1 | 9/2002 | Min et al. |
| 6,504,246 | B2 | 1/2003 | Roth et al. |
| 6,711,726 | B2 | 3/2004 | Hirakimoto et al. |
| 6,742,170 | B2 | 5/2004 | Elzinga et al. |
| 6,806,558 | B2 | 10/2004 | Apel |
| 6,848,093 | B2 | 1/2005 | Elzinga |
| 6,951,007 | B2 | 9/2005 | Kaida |
| 2001/0035529 | A1 | 11/2001 | Bertin et al. |
| 2002/0056912 | A1 | 5/2002 | Roth et al. |
| 2002/0079587 | A1 | 6/2002 | Houston |
| 2003/0212976 | A1* | 11/2003 | Drumm ....................... 716/12 |
| 2004/0243956 | A1* | 12/2004 | Tetelbaum et al. ............. 716/6 |

(Continued)

FOREIGN PATENT DOCUMENTS

JP  8315583 A  11/1996

(Continued)

OTHER PUBLICATIONS

P. Gupta and A.B. Kahng. "Wire Swizzling to Reduce Delay Uncertainty Due to Capacitive Coupling". Proceedings of IEEE Intl. Conference on VLSI Design, Jan. 2004.

(Continued)

*Primary Examiner*—Stacy A Whitmore
(74) *Attorney, Agent, or Firm*—Gibb & Rahman, LLC; Richard M. Kotulak, Esq.

(57) ABSTRACT

Disclosed are embodiments of an interconnection array for a circuit. The interconnection array comprises a victim net that is positioned parallel to and adjacent to sections of multiple crossed aggressor nets, thereby, minimizing the exposure of the circuit to delay or false switching as a result of coupling capacitance. Also, disclosed are embodiments of an associated method of re-routing an interconnection array that incorporates identifying a victim net and at least two aggressor nets and crossing the aggressor nets so that sections of multiple aggressor nets are positioned parallel to and adjacent to the victim net in order to minimizes the impact of coupling capacitance on the victim net with minimal changes to the wiring environment.

14 Claims, 6 Drawing Sheets

U.S. PATENT DOCUMENTS

2007/0106969 A1* 5/2007 Birch et al. .................. 716/6
2007/0226673 A1* 9/2007 Habitz et al. ................. 716/14

FOREIGN PATENT DOCUMENTS

JP          10308451 A    5/1997

OTHER PUBLICATIONS

D. Wu, J. Hu, M. Zhao and R. Mahaptra, "Timing Driven Track Routing Considering Coupling Capacitance", Proceedings of IEEE Intl. Conference on ASP-DAC 2005.
http://csdl2.computer.org/persagen/DLAbsToc.jsp?resourcePath=/dl/proceedings/&toc=co.

* cited by examiner

METHOD FOR RE-ROUTING AN INTERCONNECTION ARRAY TO IMPROVE SWITCHING BEHAVIOR IN A SINGLE NET AND AN ASSOCIATED INTERCONNECTION ARRAY STRUCTURE

BACKGROUND

1. Field of the Invention

The embodiments of the invention generally relate to routed wiring design, and, more particularly, to a routed wiring design with minimized correlated coupling between nets and an associated method of reducing correlated coupling between nets.

2. Description of the Related Art

Coupling capacitance occurs between parallel nets. This coupling causes crosstalk noise, which in turn can cause signal delays and circuit failure. Specifically, if the switching window of parallel adjacent nets overlap one net may act as an aggressor net impacting the switching time (i.e., the time when an output transition from low to high voltage or high to low voltage occurs) and/or the slew rate (i.e., the rate of change of output from low to high voltage or high to low voltage) of the adjacent net (i.e., the victim net). For example, when aggressor and victim nets switch at overlapping times, but in opposite directions (i.e., low to high or high to low) and/or at different slew rates, the slew rate of the victim net can be increased or decreased and the switching time of the victim net can occur earlier or later. Increasing the slew rate or causing the switching time of the victim net to occur later can cause setup time violations (e.g., at flip-flops or latches) or output timing window errors. Decreasing the slew rate or causing the switching time of the victim net to occur earlier can cause hold time violation.

One technique that has been used to avoid coupled noise induced timing fails is to move wires apart and in this way to reduce the coupling capacitance. This method does not work well in highly congested chip areas, were there is no additional space for the enlarged isolator distance. Other methods common are the creation of more timing margin by using stronger drivers. In critical nets this method is already exhausted. Therefore, there remains a need in the art for a method that re-routes an array to minimize correlated coupling between nets in congested wiring areas with minimal upset of the current design.

SUMMARY

In view of the foregoing, disclosed are embodiments of an interconnection array for a dense circuit. The interconnection array comprises a victim net that is positioned parallel to and adjacent to sections of multiple crossed aggressor nets, thereby, minimizing the exposure of the circuit to delay or false switching as a result of coupling capacitance. Also disclosed are embodiments of an associated method of re-routing an interconnection array that incorporates identifying a victim net and at least two aggressor nets and crossing the aggressor nets so that sections of multiple aggressor nets are positioned parallel to and adjacent to the victim net in order to minimize the noise impact of coupling capacitance on the victim net with minimal changes to the wiring environment.

More particularly, disclosed is an embodiment of an interconnection array that comprises a victim net (i.e., a first net) and two or more aggressor nets (i.e., a second net, third net, etc.) that are all oriented in the same direction and, for the most part, all located on the same wiring level. Each of the nets has a corresponding switching behavior (e.g., switching window, slew rate, switching time and switching direction). That is, the first net has a first switching behavior, the second net has a second switching behavior, the third net has a third switching behavior, and so on.

The first net is linear. Contrarily, the second and third nets are crossed or twisted such that sections of each of the second and third nets are parallel to and adjacent to one side of the first net. Thus, crosstalk noise resulting from coupling capacitance is distributed over the various aggressor nets, which thus have a combined impact on the switching behavior of the first net. Specifically, since statistically it is likely that the switching behavior of the second and third nets will be different, the combined impact on the first switching behavior of coupling capacitances between the first net and the sections of the second and third nets will be reduced as compared to the impact if only a single aggressor net (e.g., the second net alone) was positioned adjacent to the first net. Furthermore, the second and third nets can be crossed with additional aggressor nets so that additional sections of additional nets are positioned parallel to and adjacent to that same side of the first net. By increasing the number of aggressor nets that have sections that are adjacent to the first net, the combined impact of coupling capacitance on the first switching behavior can be even further reduced.

In an exemplary embodiment, the interconnection array can be configured so that each section that is adjacent to the first net has a predetermined maximum length. In another exemplary embodiment, the interconnection array can be configured with aggressor nets that are selected and crossed so that the combined coupling capacitance that impacts the first net is below a predetermined maximum.

Also disclosed are embodiments of a method for re-routing nets in an interconnection array, where the nets within the array are oriented in the same direction and located on the same wiring level (i.e., a primary wiring level the array). Each net has a corresponding switching behavior (i.e., a slew rate, switching time, switching direction and switching window). That is, a first net has a first switching behavior, a second net has a second switching behavior, and so on.

The embodiments of the method comprise identifying from amongst the different nets in the array one net (i.e., a first net) that fails a timing requirement as a result of crosstalk noise due to coupling capacitance with another net (i.e., a second net) such that the first net is considered a victim net and the second net is considered an aggressor net.

In addition to identifying the first net (i.e., the victim net), the second net (i.e., the original aggressor net), which causes the victim net to fail, is also identified. Specifically, the second net is identified as that net which is parallel to and adjacent to the first net, and which, as a result of coupling capacitance, impacts the switching behavior of the first net (i.e., the first switching behavior) causing the first net to fail the timing requirement.

Once the first net and the second net are identified, a third net (i.e., another aggressor net) is selected from amongst the other nets in the array to be crossed with the second net. Selection of the third net is limited to a net that has a short empty track in a wiring level above or below the primary wiring level. Statistically, the switching behavior (i.e., the activity, slew rate, switching time and/or switching direction) of any aggressor net that meets the selection requirements will likely be different from the switching behavior of the second net (i.e., the second switching behavior). Thus, once the second and third nets are crossed, the combined impact of coupling capacitance on the first net will be reduced as compared to the impact of coupling capacitance between the first net and the second net alone.

Optionally, in addition to identifying a third net for crossing with the second net, one or more additional aggressor nets can also be selected in the same manner, as described above, for crossing.

Once the third net and, optionally, the additional nets, are selected, the second net and these selected aggressor nets are re-routed so that they are crossed. By re-routing these multiple aggressor nets (i.e., the second net, third net, and any additional nets) so that they are crossed and so that sections of each of the multiple aggressor nets are positioned parallel to and adjacent to one side of the first net, their switching behaviors (i.e., the second switching behavior of the second net, the third switching behavior of the third net, the additional switching behaviors of any additional nets, etc.) will have a combined impact on the first switching behavior of the first net. Specifically, since the switching behaviors (i.e., the activity, switching windows, slew rates, switching times, and/or the switching directions) of these multiple aggressor nets will be statistically varied and they may cancel each other out. Thus, the combined impact of coupling capacitances on the slew rate and the switching time of the first net will be reduced as compared to the impact of coupling capacitance between the first net and the second net alone.

The process of re-routing the nets can be accomplished by locating the empty tracks in the coupled region above or below the primary wiring level on which the victim and aggressor nets are located (i.e., in the wiring level either above or below the second net or third net). Then, additional vias can be formed to the empty tracks and wires can be formed through the empty tracks to allow crossing of the nets. During this re-routing process, the sum of all coupling capacitances to the first net can be maintained so that the uncoupled load remains unchanged. Furthermore, limits can be placed on the selection and re-routing processes to ensure that all couplings of the victim to neighbors are smaller than a given threshold. For example, a limit can be set that prevents each of the sections of the multiple aggressor nets that are adjacent to the victim net from being longer than a predetermined maximum length. Another limit, providing that no more than a maximum coupling capacitance can be established between the first net and the sections of the multiple crossed aggressor nets, can also be set.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

Figure 1:
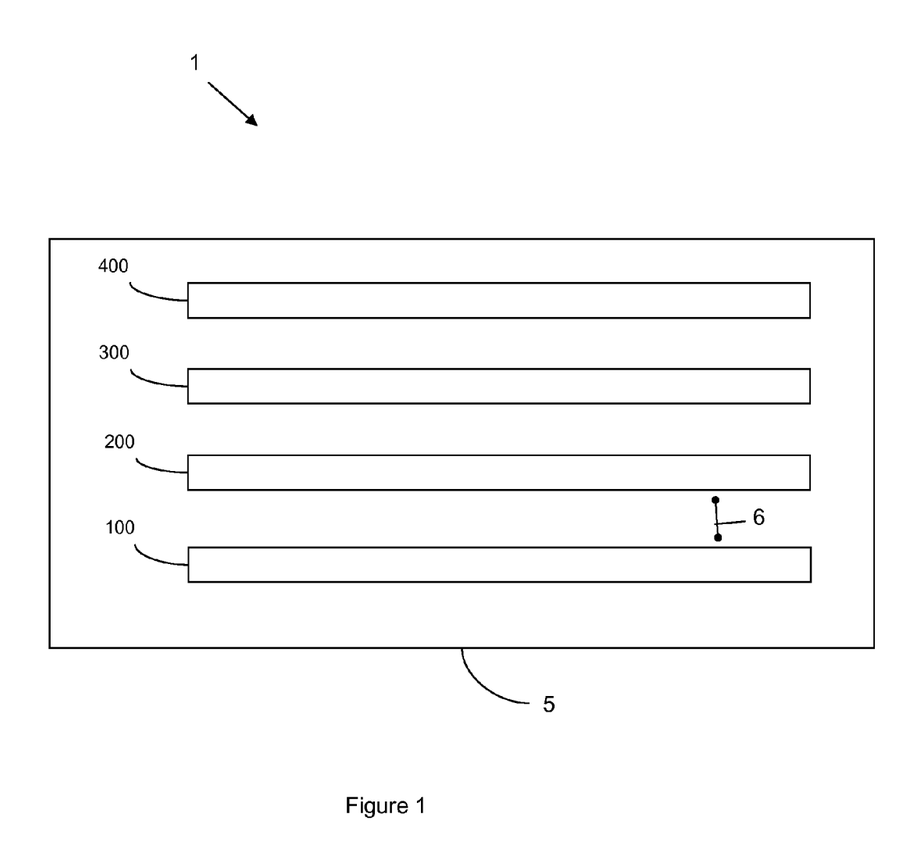
FIG. 1 is a diagram illustrating a top view of an interconnection array with a plurality of parallel nets on a single wiring level.

FIG. 1 is a diagram illustrating an interconnect array 1 having a plurality of parallel adjacent nets 100-400 on a single wiring level 5. As mentioned above, coupling capacitance occurs between parallel nets 100-400. This coupling causes crosstalk noise, which in turn can cause signal delays and circuit failure. Specifically, if the switching window of parallel adjacent nets (e.g., 100 and 200) overlap one net 200 may act as an aggressor net impacting the switching behavior of the adjacent net 100 (e.g., impacting the switching time (i.e., the time when an output transition from low to high voltage or high to low voltage occurs) and/or the slew rate (i.e., the rate of change of output from low to high voltage or high to low voltage) of the adjacent net 100 (i.e., the victim net). For example, when aggressor 200 and victim 100 nets switch during overlapping switching windows, but in opposite directions (i.e., low to high or high to low), at different slew rates and/or at different switching times, the resulting slew rate of the victim net 100 can be increased or decreased and the switching time of the victim net can occur earlier or later. Increasing the slew rate or causing the switching time of the victim net 100 to occur later can cause setup time violations (e.g., at flip-flops or latches) or output timing window errors. Decreasing the slew rate or causing the switching time of the victim net 100 to occur earlier can cause hold time violations.

As mentioned above, one technique that has been used to avoid coupled noise induced timing fails is to move wires apart (e.g., to increase the distance 6 between wires 100 and 200) and in this way to reduce the coupling capacitance. This method does not work well in highly congested chip areas, were there is no additional space for the enlarged isolator distance. Other methods common are the creation of more timing margin by using stronger drivers. In critical nets this method is already exhausted. Therefore, there remains a need in the art for a method that that re-routes an array to minimize correlated coupling between nets in congested wiring areas with minimal upset of the current design.

Figure 2:
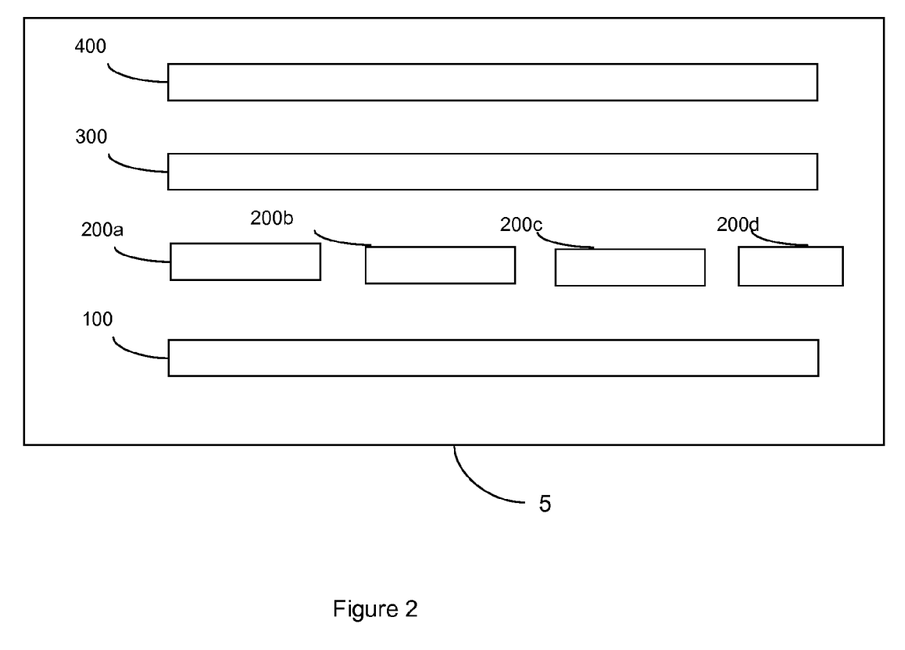
FIG. 2 is a diagram illustrating how the interaction of the wire 100 to 200 is reduced by breaking-up wire 200 into 200a, 200b, 200c, and 200d.

Referring to FIG. 2, breaking up a single interaction into many interactions (e.g., breaking up aggressor net 200 into 200a-d) effectively removes the noise impact of the coupled capacitance on the victim 100 delay. Thus, in view of the foregoing, embodiments of the structure and method of the invention disclosed herein break up a single aggressor net into many smaller ones. These embodiments rely on the randomness of circuit switching statistics. That is, in random logic any aggressor net can be quiet or have rising or falling transitions. If many 'aggressor' nets, as opposed to a single aggressor net, are connected to a single 'victim' net via coupling capacitance, the effect is the sum of all the interactions. Since, statistically, it is likely that the multiple aggressor nets will have varying switching behaviors, the overall interaction results in a canceling out of noise so that the noise impact is negligible. This is accomplished without requiring any significant additional space or without changing significantly the overall capacitive load. Thus, the embodiments of the invention are perfectly suited to fix noise induced delay changes at the end of the design cycle with minimal disturbance on the design.

More particularly, disclosed are embodiments of an interconnection array for a dense circuit. The interconnection array comprises a victim net that is positioned parallel to and adjacent to sections of multiple crossed aggressor nets, thereby, minimizing the exposure of the circuit to delay or false switching as a result of coupling capacitance. Also disclosed are embodiments of an associated method of re-routing an interconnection array that incorporates identifying a victim net and at least two aggressor nets and crossing the aggressor nets so that sections of multiple aggressor nets are positioned parallel to and adjacent to the victim net in order to minimizes the impact of coupling capacitance on the victim net with minimal changes to the wiring environment.

Embodiments of the interconnection array of the invention (see array 3 of FIG. 3 and array 4 of FIG. 4) comprise a victim net 100 (i.e., a first net) and at least two aggressor nets 200-400. The victim and aggressor nets 100-400 are all oriented in the same direction and, for the most part located on the same wiring level (i.e., a primary wiring level). Each of the nets 100-400 has a corresponding switching behavior (i.e., a switching window, a slew rate, a switching time and a switching direction). That is, the first net 100 has a first switching behavior, the second net 200 has a second switching behavior, the third net 300 has a third switching behavior, and so on. Statistically, these switching behaviors will vary.

Figure 3:
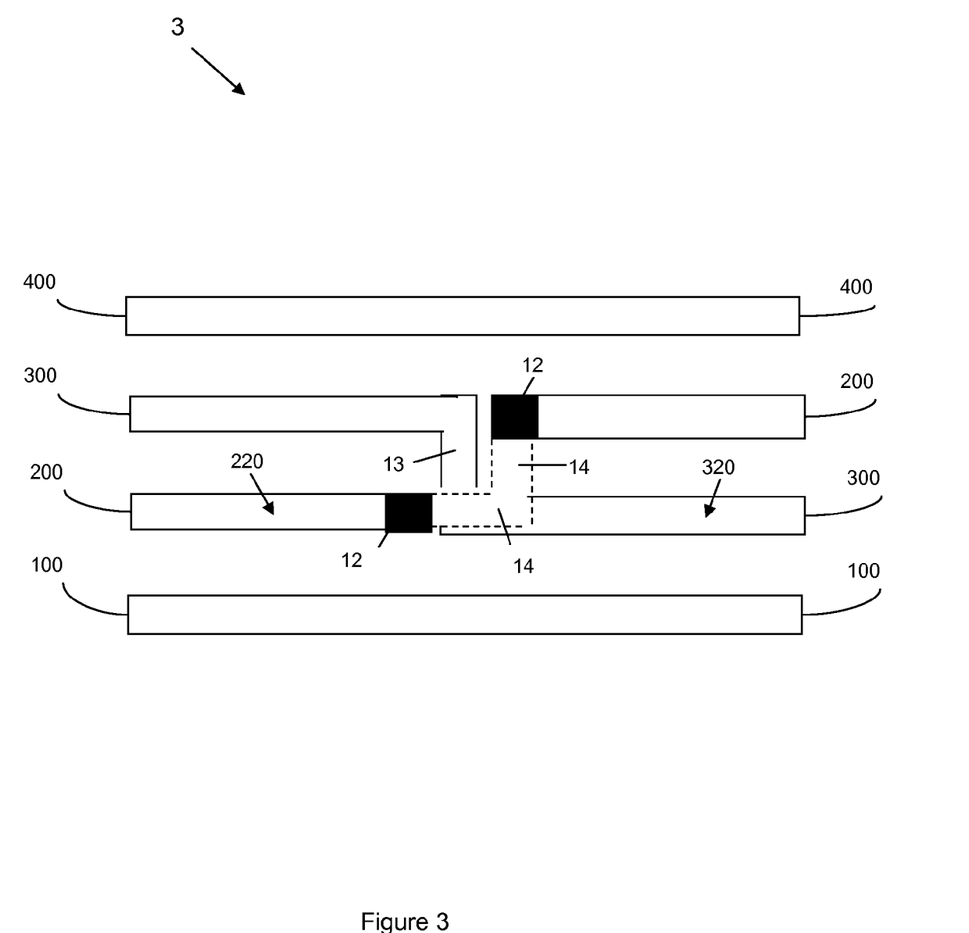
FIG. 3 is a diagram illustrating one embodiment of the interconnection array of the invention.

Referring to FIG. 3, the victim net 100 (i.e., the first net) is linear. Contrarily, the second and third nets 200 and 300 (i.e., aggressor nets) are crossed or twisted such that sections 220, 320 of each of the aggressor nets are parallel to and adjacent a first side 170 of the first net 100. Crossing is accomplished by means of additional wires 13 on the same wiring level, additional wires 14 either on wiring levels above (as illustrated) or below the coupled region and additional vias 12. Thus, crosstalk noise resulting from coupling capacitance is distributed over the various aggressor nets 200, 300, which thus have a combined impact on the switching behavior (i.e., the slew rate and switching time) of the first net 100. That is, since both the second and third nets 200, 300 are aggressor nets with respect to the first net 100 and both have sections 220, 320 that are positioned adjacent to the first net 100, their switching behavior (i.e., switching windows, activity, slew rates, switching times and switching directions) can impact the first switching behavior of the first net 100. Specifically, since statistically the second and third switching behaviors of the second and third nets 200, 300 will be different, the combined impact of coupling capacitances between first net 100 and the sections 220, 320 on the first switching behavior can be reduced as compared to the impact of coupling capacitance on the first switching behavior if only a single aggressor net (e.g., the second net along) was positioned adjacent to the first net 100).

Figure 4:
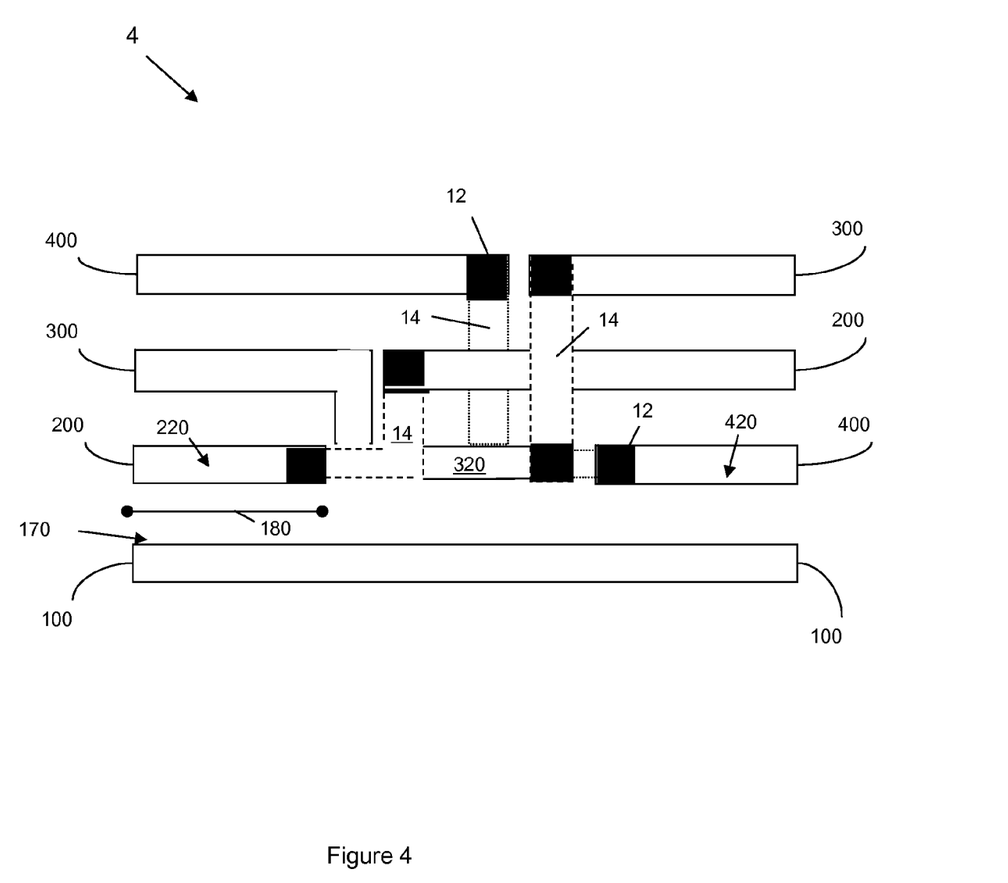
FIG. 4 is a diagram illustrating combined effect of multiple aggressor nets on the slew rate and switching time of a victim net.
Figure 5:
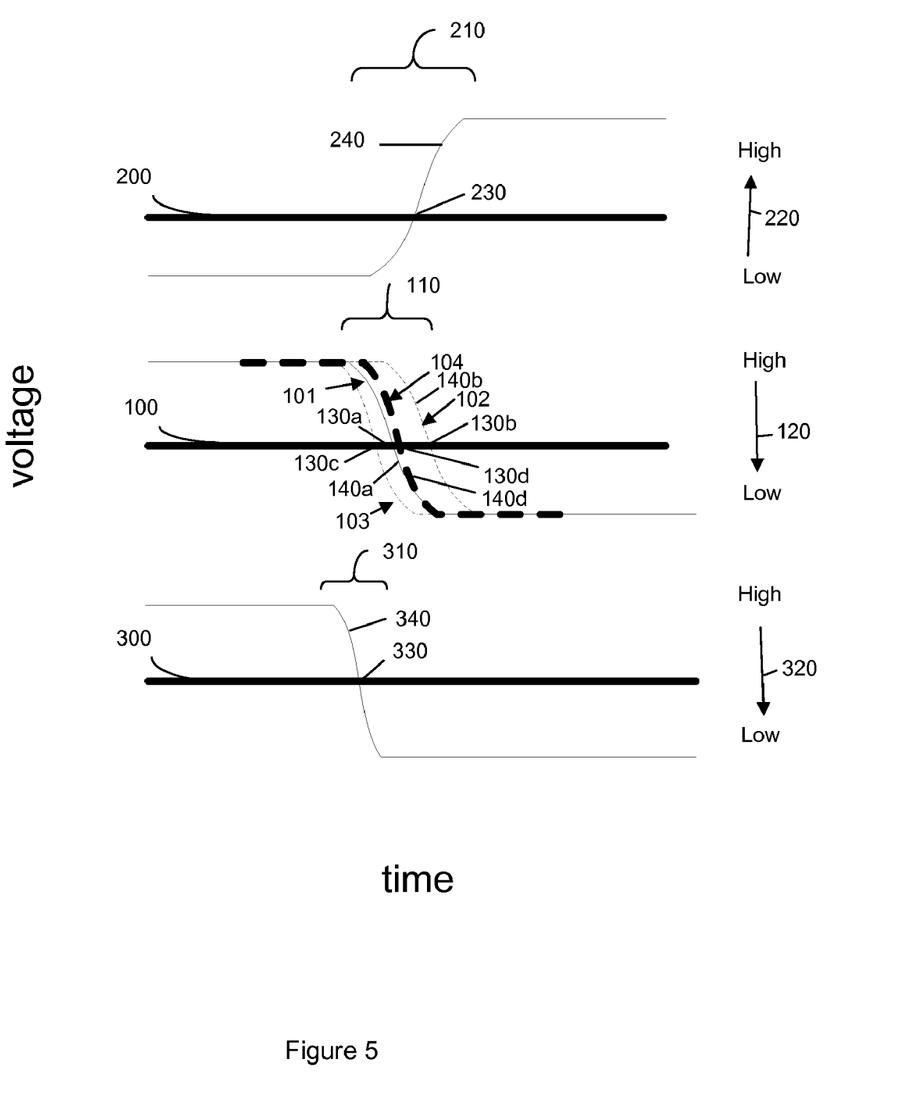
FIG. 5 is a diagram illustrating another embodiment of the interconnection array of the invention.

FIG. 4 illustrates the combined impact of exemplary aggressor nets 200 and 300 on the switching behavior of net 100. Line 101 illustrates the switching transition of net 100 with a switching time of 130a and a slew rate of 140a in the absence of coupling capacitance form any adjacent nets. As illustrated, net 200 has a switching window 210 that overlaps the switching window 110 of net 100, has a switching time 230 that is later that the switching time 130a of net 100, has a switching direction 220 that is the different than the switching direction 120 of net 100 and has a slew rate 240 that is slower than the slew rate 140a of net 100. Line 102 illustrates the later switch time 130b and altered slew rate 140b of net 100 when subjected to coupling capacitance with net 200 alone. As illustrated, net 300 has a switching window 310 that overlaps the switching window 110 of net 100, has a switching time 330 that is earlier than the switching times 130a of net 100 and 230 of net 200, has a switching direction 320 that is the same as the switching direction 120 of net 100 and different from the switching direction 220 of net 200 and has a slew rate 340 that is faster than the slew rates 140a of net 100 and 240 of net 200. Line 103 illustrates the earlier switch time 130c and altered slew rate 140c of net 100 when subjected to coupling capacitance with net 300 alone. Line 104 illustrates the combined impact of both net 200 and net 300 on net 100 when nets 200 and 300 are crossed so that sections of each net are adjacent to net 100. Specifically, line 104 illustrates that with both the second and third nets 200, 300 acting as aggressor nets with respect to the first net 100, the combined impact of coupling capacitance on the slew rate and the switching time of the first net 100 can be reduced as compared to the impact of coupling capacitance between the first net 100 and either the third net 300 or second net 200 alone.

Furthermore, referring to FIG. 4, the second and third nets 200, 300 can be also be crossed with other aggressor nets (e.g., one or more additional nets 400, each having its own switching behavior) so that additional sections 420 of the additional nets 400 are positioned parallel to and adjacent to the first side 170 of the first net 100. As with the array 3 of FIG. 3, crossing is accomplished by means of additional wires 13 on the same wiring level 10, additional wires 14 on wiring levels above and/or below the coupled region (as illustrated) and additional vias 12. By increasing the number of aggressor nets with sections that are adjacent to the victim net 100, the combined impact of coupling capacitance on the switching behavior (i.e., the slew rate and/or the switching time) of the victim net can be even further reduced.

In an exemplary embodiment, the interconnection array of FIG. 3 or 4 can be configured with a predetermined number of crossed aggressor nets 200-400 and so that each section (e.g., section 220, section 320, section 420, etc.) that is adjacent to the victim net 100 has a predetermined maximum length 180, as illustrated in FIG. 4. For example, the predetermined maximum length 180 can be set at approximately 100 micrometers. In another exemplary embodiment, the interconnection array of FIG. 3 or 4 can be configured with aggressor nets that are selected and crossed so that the coupling capacitance impacting the victim net 100 (i.e., the combined total coupling capacitance between the first net and all of the sections 220, 320, 420, etc. of aggressor nets) is below a predetermined maximum (e.g., approximately 10 femtoFarads (fF)).

Figure 6:
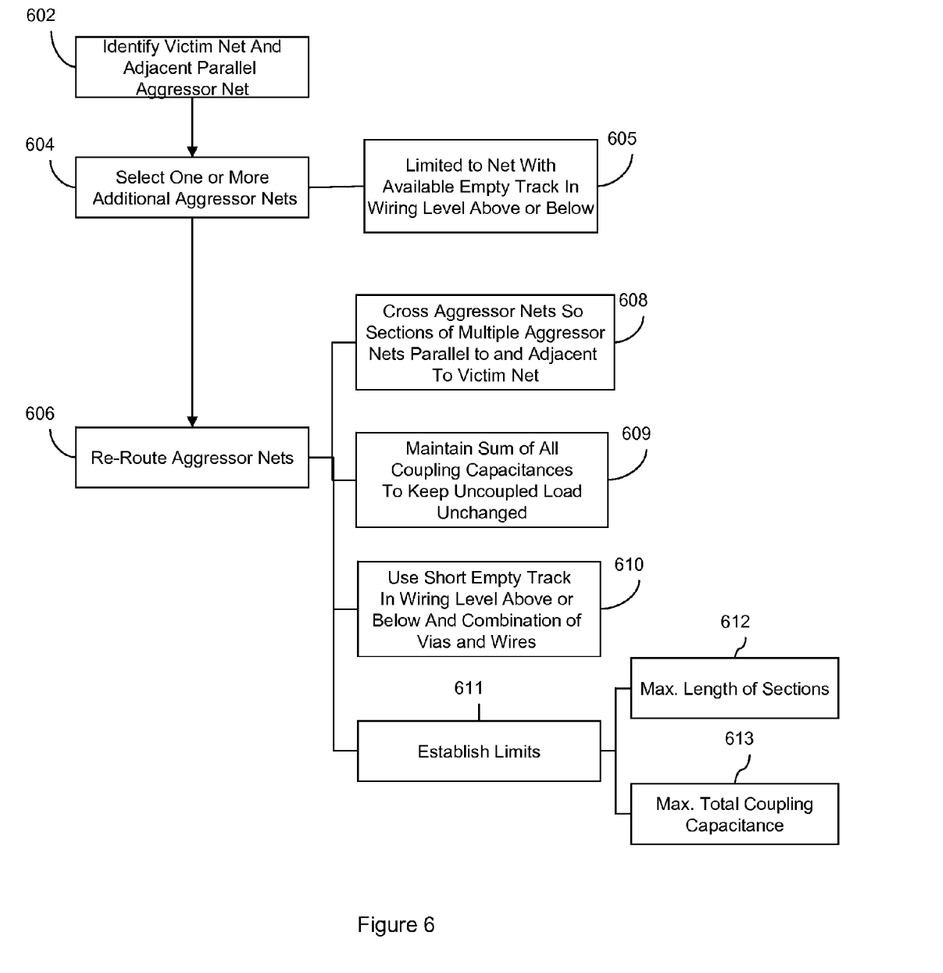
FIG. 6 is a flow diagram illustrating an embodiment of the method of the invention.

Referring to FIG. 6 in combination with FIG. 3, also disclosed are embodiments of a method for re-routing nets in an interconnection array, where the nets within the array are oriented in the same direction and located on the same wiring level (i.e., a primary wiring level the array). Each net has a corresponding switching behavior (i.e., a slew rate, a switching time, a switching direction and a switching window). That is, a first switching behavior for a first net, a second switching behavior for a second net, a third switching behavior for a third net, and so on.

The embodiments of the method comprise identifying from amongst the different nets 100-400 in the array one net (i.e., a first net 100) that fails a timing requirement as a result of crosstalk noise due to coupling capacitance with another net (i.e., a second net 200) such that the first net 100 is considered a victim net and the second net 200 is considered an aggressor net (602). Specifically, as a result of coupling capacitance with the second net, the first switching behavior is altered. For example, the slew rate of the first net 100 is increased or decreased and/or the switching time of the first net 100 is moved up or back, thereby, causing the first net 100 to fail a timing requirement. Identifying this victim net (i.e., the first net) can be accomplished, for example, using a timing analysis tool with noise analysis capabilities.

In addition to identifying the first net 100 (i.e., the victim net), the second net 200 (i.e., the original aggressor net), which causes the first net 100 to fail, is also identified (602). Specifically, the second net 200 is identified as that net which has a switching window that overlaps the switching window of the victim net, that is parallel to and adjacent to the victim net, and that, as a result of coupling capacitance, impacts the first switching behavior (i.e., the slew rate and/or the switching time) of the first net 100 causing it to fail the timing requirement.

Once the first net 100 (i.e., the victim net) and the second net 200 (i.e., the original aggressor net) are identified, a third net 300 (i.e., another aggressor net) is selected from amongst the other nets in the array to be crossed with the second net 200 (604). Selection of a third net 300 is limited to a net to a net 300 with an available empty track in a wiring level above or below (605). Statistically, the switching behavior (i.e., the activity, slew rates, switching times, switching windows and switching directions) of any aggressor net that meets the selection requirements will likely be different from the switching behavior of the second net (i.e., the second switching behavior). Thus, once the second 200 and third 300 nets are crossed (at process 608 discussed below), the combined impact of coupling capacitance on the first net will be reduces as compared to the impact of coupling capacitance between the first net and the second net alone.

Referring also to FIG. 4 in combination with FIG. 6, optionally at process 604, one or more additional nets 400 can also be selected in the same manner for crossing with the second and third nets 200, 300 so that one or more additional sections 420 are also positioned parallel to and adjacent to the first side of the first net.

Once the third net 300 and, optionally, the additional nets 400, are selected, the second net 200, third net 300 and any additional nets 400 are re-routed (606) so that they are crossed (608), thereby, positioning sections 220, 320, etc. of each of the multiple aggressor nets 200, 300, etc. parallel to and adjacent to one side 170 of the first net 100 (see FIG. 4). By re-routing these multiple aggressor nets (i.e., the second net, third net, and any additional nets) in this manner, their switching behaviors (i.e., the second switching behavior of the second net, the third switching behavior of the third net, etc.) will have a combined impact of the first switching behavior of the first net 100. That is, statistically the activity, switching windows, slew rates, switching times, and/or the switching directions of these multiple aggressor will be varied and will likely cancel each other out. Thus, the combined impact of coupling capacitance on the switching behavior (i.e., the slew rate and the switching time) of the first net 100 will be reduced as compared to the impact of coupling capacitance between the first net 100 and the second net 200 alone.

The process of re-routing the nets (606) can be accomplished by selecting at process 604 only those nets with short empty tracks in the coupled region above or below the primary wiring level on which the victim and aggressor nets are located (i.e., in the wiring level either above or below the second net or third net) (605). Then, additional vias can be formed to these empty tracks and wires can be formed through the empty tracks to allow crossing of the nets (610). During this re-routing process, the sum of all coupling capacitances to the first net can be maintained so that the uncoupled load remains unchanged (609). Furthermore, limits can be placed on the selection and re-routing processes to ensure that all couplings of the victim to neighbors are smaller than a given threshold (611). For example, a limit can be set that prevents each of the sections 220, 320, etc. of the multiple aggressor nets 200, 300, etc. that are adjacent to the victim net 100 from being longer than a predetermined maximum length (e.g., approximately 100 micrometers) (612, see length 180 of FIG. 4). Another limit, which provides that no more than a maximum coupling capacitance (e.g., approximately 10 femtoFarads (fF)) can be established between the first net 100 and the sections 220, 320, etc., of the multiple crossed aggressor nets, can also be set (613).

Retiming of the changed design will prove that the larger number of interactions has significantly reduced the fail probability. Thus, embodiments of the invention can be implemented on all semiconductor chip types. However, it should be noted that this wire twisting technique would not be suitable for implementation within a data-bus, as the nets in a data-bus are simultaneously active.

Furthermore, embodiments of the invention can be implemented by an entirely hardware embodiment, an entirely software embodiment (e.g., implemented by electronic design automation (EDA) software) or an embodiment including both hardware and software elements. In an embodiment, the invention is implemented in software, which includes but is not limited to firmware, resident software, microcode, etc. Furthermore, embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Therefore, disclosed above, are embodiments of an interconnection array for a dense circuit. The interconnection array comprises a victim net that is positioned parallel to and adjacent to sections of multiple crossed aggressor nets, thereby, minimizing the exposure of the circuit to delay or false switching as a result of coupling capacitance. Also, disclosed are embodiments of an associated method of re-routing an interconnection array that incorporates identifying a victim net and at least two aggressor nets and crossing the aggressor nets so that sections of multiple aggressor nets are positioned parallel to and adjacent to the victim net in order to minimizes the impact of coupling capacitance on the victim net with minimal changes to the wiring environment.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:

1. A method of re-routing an interconnection array, said method comprising:
    using a timing analysis tool with noise analysis capabilities to identify a first net, from a plurality of nets in said interconnection array, that has a first switching behavior and fails a timing requirement and further to identify a second net, from said plurality of nets, that has a second switching behavior, that is parallel to and adjacent to one side of said first net, and that is capacitively coupled to said first net, wherein an impact of coupling capacitance between said first net and said second net on said first switching behavior causes said first net to fail said timing requirement;
    selecting a third net that has a third switching behavior different from said second switching behavior; and
    re-routing said second net and said third net such that said second net and said third net are crossed and such that sections of both said second net and said third net are parallel to said one side of said first net, are adjacent to said one side of said first net, and are capacitively coupled to said first net, wherein a combined impact of coupling capacitances between said first net and said sections on said first switching behavior is reduced as compared to said impact of coupling capacitance between said first net and said second net alone.

2. The method of claim 1, wherein said re-routing comprises:
    one of locating an empty track above one of said second net and said third net and locating an empty track below one of said second net and said third net; and
    forming additional vias to said empty track and wires through said empty track to allow crossing of said second net and said third net.

3. The method of claim 1, further comprising:
    identifying at least one additional net; and
    during said re-routing, simultaneously re-routing said additional net such that said additional net is crossed with said second net and said third net and such that an additional section of said additional net is parallel to and adjacent to said one side of said first net.

4. The method of claim 1, wherein said re-routing comprises re-routing so that no more than a predetermined maximum coupling capacitance is established between said first net and said sections.

5. The method of claim 1, wherein said re-routing comprises re-routing so that each of said sections is no longer than a predetermined maximum length.

6. The method of claim 1, wherein said method further comprises, during said re-routing, maintaining a sum of all coupling capacitances to said first net so as to avoid changing an uncoupled load on said first net.

7. A method of re-routing an interconnection array, said method comprising:
    using a timing analysis tool with noise analysis capabilities to identify a first net, from a plurality of nets in said interconnection array, that has a first switching behavior and fails a timing requirement and further to identify a second net, from said plurality of nets, that has a second switching behavior, that is parallel to and adjacent to one side of said first net, and that is capacitively coupled to said first net, wherein an impact of coupling capacitance between said first net and said second net on said first switching behavior causes said first net to fail said timing requirement;
    selecting a third net that has a third switching behavior different from said second switching behavior; and
    re-routing said second net and said third net such that said second net and said third net are crossed and such that sections of both said second net and said third net are parallel to said one side of said first net, are adjacent to said one side of said first net, and are capacitively coupled to said first net; and
    during said re-routing, maintaining a sum of all coupling capacitances to said first net so that no more than a predetermined maximum coupling capacitance is established between said first net and said sections,
    wherein a combined impact of coupling capacitances between said first net and said sections on said first switching behavior is reduced as compared to said impact of coupling capacitance between said first net and said second net alone.

8. The method of claim 7, wherein said re-routing comprises:
    one of locating an empty track above one of said second net and said third net and locating an empty track below one of said second net and said third net; and
    forming additional vias to said empty track and wires through said empty track to allow crossing of said second net and said third net.

9. The method of claim 7, further comprising:
    identifying at least one additional net; and
    during said re-routing, simultaneously re-routing said additional net such that said additional net is crossed with said second net and said third net and such that an additional section of said additional net is parallel to and adjacent to said one side of said first net.

10. The method of claim 7, wherein said re-routing comprises re-routing so that each of said sections is no longer than a predetermined maximum length.

11. The method of claim 7, wherein maintaining said sum of all coupling capacitances to said first net avoids changing an uncoupled load on said first net.

12. An interconnection array comprising:
    a first net having a first switching behavior;
    a second net having a second switching behavior; and
    a third net having a third switching behavior different from said second switching behavior,
    wherein said first net is linear and said second net and said third net are crossed such that sections of both said second net and said third net are parallel to and adjacent to one side of said first net, and
    wherein said sections each have a predetermined length so that coupling capacitance between said first net and said sections is not greater than a predetermined maximum coupling capacitance and so that said coupling capacitance has a combined impact on said first switching behavior of said first net, said combined impact being less than an impact of coupling capacitance on said first switching behavior if only said second net was parallel to and adjacent to said first net.

13. The interconnection array of claim 12, further comprising at least one additional net, wherein said additional net is crossed with said second net and said third net such that an additional section of said additional net is parallel to and adjacent to said first net.

14. A program storage device readable by computer and tangibly embodying a program of instructions executable by said computer to perform a method of reducing the effect of coupling capacitance on a net, said method comprising:

using a timing analysis tool with noise analysis capabilities to identify a first net, from a plurality of nets in said interconnection array, that has a first switching behavior and fails a timing requirement and further to identify a second net, from said plurality of nets, that has a second switching behavior, that is parallel to and adjacent to one side of said first net, and that is capacitively coupled to said first net, wherein an impact of coupling capacitance between said first net and said second net on said first switching behavior causes said first net to fail said timing requirement;

selecting a third net that has a third switching behavior different from said second switching behavior; and re-routing said second net and said third net such that said second net and said third net are crossed and such that sections of both said second net and said third net are parallel to said one side of said first net, are adjacent to said one side of said first net, and are capacitively coupled to said first net, wherein a combined impact of coupling capacitances between said first net and said sections on said first switching behavior is reduced as compared to said impact of coupling capacitance between said first net and said second net alone.

* * * * *